(12) United States Patent
Park

(10) Patent No.: US 7,165,230 B2
(45) Date of Patent: Jan. 16, 2007

(54) SWITCH METHODOLOGY FOR MASK-PROGRAMMABLE LOGIC DEVICES

(75) Inventor: Jonathan Park, San Jose, CA (US)

(73) Assignee: Altera Corporation, San Jose, CA (US)

( * ) Notice: Subject to any disclaimer, the term of this patent is extended or adjusted under 35 U.S.C. 154(b) by 352 days.

(21) Appl. No.: 10/859,742

(22) Filed: Jun. 2, 2004

(65) Prior Publication Data

US 2005/0280438 A1 Dec. 22, 2005

(51) Int. Cl.
*G06F 17/50* (2006.01)

(52) U.S. Cl. .............. 716/3; 716/16; 716/17

(58) Field of Classification Search ............ 716/3, 716/16, 17
See application file for complete search history.

(56) References Cited

U.S. PATENT DOCUMENTS

| | | | |
|---|---|---|---|
| 3,922,526 A * | 11/1975 | Cochran | 713/321 |
| 4,847,612 A * | 7/1989 | Kaplinsky | 326/10 |
| 5,514,995 A * | 5/1996 | Hennig | 327/399 |
| 5,825,202 A | 10/1998 | Tavana et al. | 326/39 |
| 5,874,834 A | 2/1999 | New | 326/39 |
| 6,091,262 A | 7/2000 | New | 326/39 |
| 6,094,065 A | 7/2000 | Tavana et al. | 326/39 |
| 6,242,945 B1 | 6/2001 | New | 326/39 |
| 6,490,707 B1 | 12/2002 | Baxter | 716/2 |
| 6,515,509 B1 | 2/2003 | Baxter | 326/39 |
| 6,526,563 B1 | 2/2003 | Baxter | 716/18 |

* cited by examiner

*Primary Examiner*—Sun James Lin
(74) *Attorney, Agent, or Firm*—Fish & Neave IP Group, Ropes & Gray LLP; Jeffrey C. Aldridge

(57) ABSTRACT

A mask-programmable logic device that implements a pre-existing circuit design and that includes programmable smart switches is provided. The smart switches are metal terminals that may be programmed to perform configuration-related logic functions of the pre-existing circuit design.

20 Claims, 12 Drawing Sheets

EQ = @$R_B$ ? B : A $EQ = R_1 ? B : A$ $EQ = @R_D ? D : @R_C ? C : @R_B ? B : A$ $EQ = (\bar{R}_1 \cdot \bar{R}_2 \cdot \bar{R}_3 \cdot \bar{R}_4) ? B : A$ $EQ = R_1 \cdot R_2 ? D : \bar{R}_1 \cdot R_2 ? C : R_1 \cdot \bar{R}_2 ? B : A$

US 7,165,230 B2

SWITCH METHODOLOGY FOR MASK-PROGRAMMABLE LOGIC DEVICES

BACKGROUND OF THE INVENTION

The present invention relates to mask-programmable logic devices, and more particularly, to methods of creating a mask-programmed logic device from a pre-existing circuit design.

Programmable logic devices (PLDs) are well known. Early programmable logic devices were one-time configurable. For example, configuration may have been achieved by "blowing" (i.e., opening) fusible links. Alternatively, configuration may have been stored in a programmable read-only memory. These devices generally provided a user with the ability to configure the devices for "sum-of-products" (or "P-TERM") logic operations. Later, such programmable logic devices incorporating erasable programmable read-only memory (EPROM) for configuration became available, allowing the devices to be reconfigured.

Still later, programmable logic devices incorporating static random access memory (SRAM) elements for configuration became available. These devices, which also can be reconfigured, store their configuration information in a nonvolatile memory such as an EPROM, from which the configuration is loaded into the SRAM elements when the device is powered up. These devices generally provided the user with the ability to configure the devices for look-up table-type logic operations. At some point, such devices began to be provided with embedded blocks of random access memory that could be configured by the user to act as random access memory (RAM), read-only memory (ROM), or logic (such as P-TERM logic).

In all of the foregoing programmable logic devices, both the logic functions of particular logic resources in the device, and the interconnect resources for routing of signals between the logic resources, were programmable. Alternatively, mask-programmable logic devices (MPLDs) have been provided. With mask-programmable logic devices, instead of selling all users the same device, a manufacturer produces a mask-programmable base device with a standardized arrangement of logic resources whose functions are not programmable by the user, and which lacks any routing or interconnect resources.

The user provides the manufacturer of the mask-programmable logic device with the specifications of a desired device, which may be the configuration information file for programming a comparable conventional programmable logic device ("source PLD"). The manufacturer uses that information to add metallization layers to the base device described above. Those additional layers program the base device's logic resources by making certain fixed connections within the resources based on the configuration information of the configurable memory (CRAM) cells of the source device (i.e., by hard coding the configuration values provided by the user's information file to power sources of the MPLD). Furthermore, these additional layers add interconnect resources for routing between the logic resources. Mask-programmable logic devices can also be provided with embedded random access memory blocks, as described above in connection with conventional programmable logic devices. In such mask-programmable logic devices, if the embedded memory is configured as read-only memory or P-TERM logic, that configuration is also accomplished using the additional metallization layers.

While conventional programmable logic devices allow a user to easily design a device to perform a desired function, they invariably include resources that may not be used for a particular design. Moreover, in order to accommodate general purpose routing and interconnect resources, and switching resources that allow signals from any logic resource to reach any desired routing and interconnect resource, conventional PLDs grow ever larger as more functionality is built into them, increasing the size and power consumption of such devices. The routing of signals through the various switching resources as they travel from one routing and interconnect resource to another also slows down signals.

The advent of mask-programmable logic devices has allowed users to prove a design in a conventional source programmable logic device, but to commit the production version to a mask-programmable logic device, which, for the same functionality, can be significantly smaller and use significantly less power, because only the interconnect and routing resources actually needed for the particular design are added to the base device. In addition, there are no general purpose switching resources consuming space or power or slowing down signals. Such implementation of a pre-existing design of a source PLD on a mask-programmable base device are described, for example, in commonly-assigned U.S. patent application Ser. No. 10/113,838, filed Mar. 29, 2002, which is hereby incorporated by reference herein in its entirety.

Such MPLDs may obtain significant die size advantage compared to the source PLD through removal of all the programmability of the source device, including signal interconnect, signal routing configuration-related logic, and configuration memories. The base device architecture of such MPLDs may be almost identical to the source device, except for the routing structures. The organization of logic resources on the base devices of such MPLDs may be different from that of associated source devices, but these resources may be identical in functionality, quantity, accessibility, and structure, therefore allowing a direct conversion of resource-for-resource from the equivalent source device to the base device.

The removal of the pre-existing signal interconnect, signal routing configuration-related logic, configuration memories, and certain signal buffers of the source device from such MPLDs may provide significant size reduction of the die and may optimize signal routing. However, although the interconnection routing and the CRAM configuration values of the logic resources are hard coded in the physical design of such MPLDs by adding metallization layers to the base device, the configuration-related logic circuitry of the logic resources of the source device are maintained on the base device to minimize design changes and project development time. These configuration-related logics include a significant amount of transistor circuitry which increases the size and power consumption of such devices.

Accordingly, it would be desirable to provide improved techniques, systems, and methods for optimizing the area and performance of a mask-programmable logic device that implements a pre-existing circuit design and that requires minimal user involvement.

SUMMARY OF THE INVENTION

In accordance with the present invention, improved techniques, systems, and methods for optimizing the area and performance of a mask-programmable logic device that implements a pre-existing circuit design are provided.

The present invention achieves greater optimization of the size, power savings, and performance of a mask-programmable logic device by modifying the base device architecture to facilitate the functionality of configuration-related logic circuitry of the source device without transistors. The modifications include replacing the source device's configuration-related logic and its CRAM configuration information with "smart" switches on the mask-programmable base device. A smart switch is a metal terminal, on top of which a metallization layer may be added to make a connection between one of the one or more input terminals of the switch and an output terminal of the switch. This connection is made based on Boolean equations that are derived from the functionality of the resource or resources the switch is replacing, and that are defined by the CRAM values associated with the resource or resources.

In accordance with the present invention, there is provided a mask-programmable logic device disposed on an integrated circuit and configured to facilitate the conversion of a pre-existing design of a source programmable logic device into the mask-programmable device. The mask-programmable logic device comprises a plurality of mask-programmable logic resources disposed on a substrate of the integrated circuit, a plurality of interconnection conductors coupled to the mask-programmable logic resources and disposed above the substrate for interconnecting the mask-programmable logic resources. At least one of the plurality of mask-programmable logic resources comprises at least one smart switch disposed on the substrate. The at least one smart switch is programmable to perform the function of configuration-related logic circuitry of the source programmable logic device design.

BRIEF DESCRIPTION OF THE DRAWINGS

The above and other advantages of the invention will be more apparent upon consideration of the following detailed description, taken in conjunction with the accompanying drawings, in which like reference characters refer to like parts throughout, and in which.

DETAILED DESCRIPTION OF THE PREFERRED EMBODIMENTS

The present invention reduces the die area and power requirement of a mask-programmable logic device, while increasing its performance and yield, by providing smart switches in place of configuration-related logic circuitry and related CRAM configuration values on the base device. The smart switches may be used to facilitate, without transistors, the functionality of configuration-related logic circuitry of a circuit design previously implemented on another integrated circuit. The base device architecture, smart switch structure, interconnection, and conversion process are described below in more detail.

The invention will now be described with reference to FIGS. 1–15.

Figure 1:
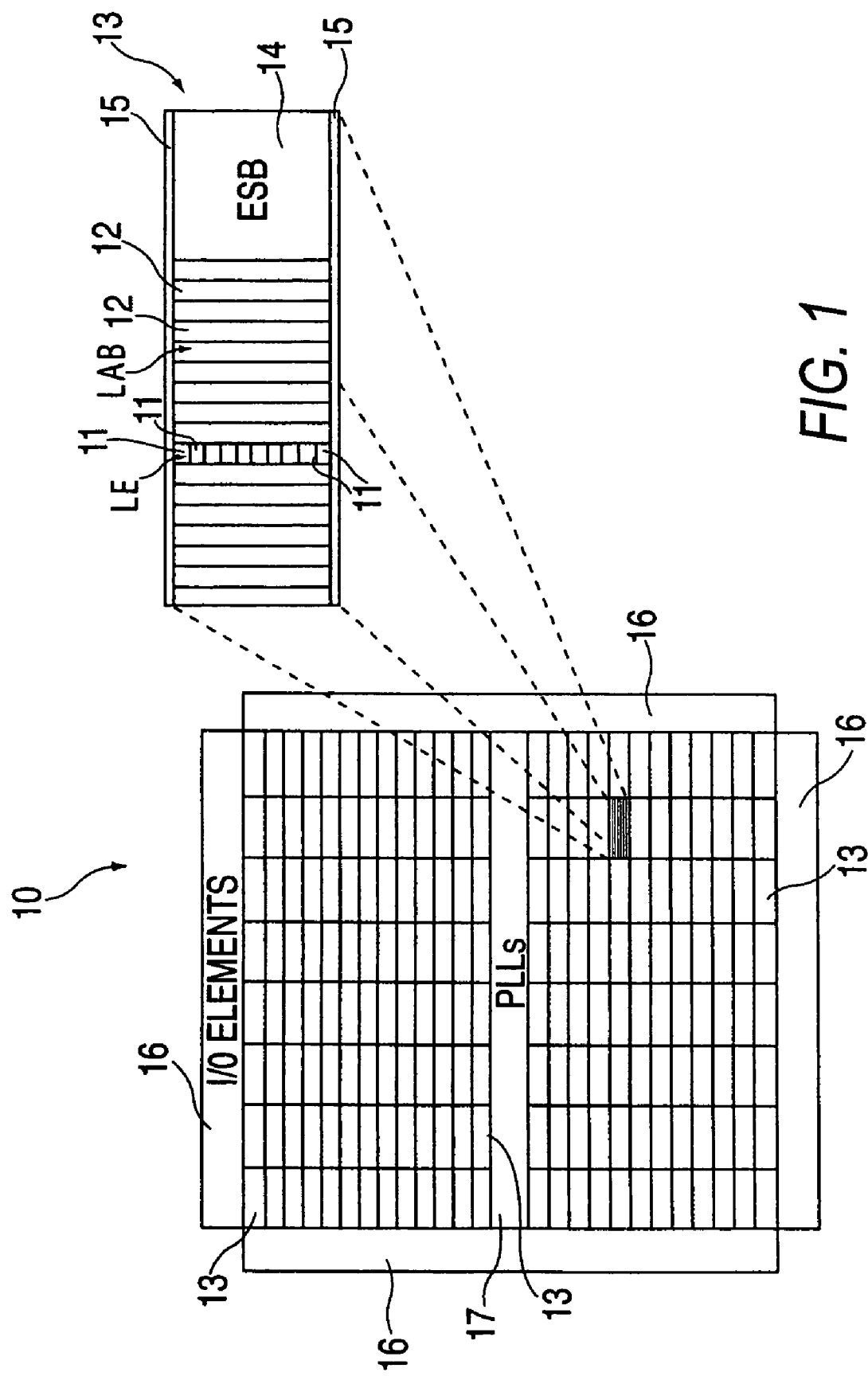
FIG. 1 is a block diagram representation of the layout of a preferred embodiment of a base device in accordance with the present invention.

As seen in FIG. 1, one embodiment of a mask-programmable base device 10 constructed in accordance with the present invention includes an array of logic resources similar to those found in the APEX® and Stratix® families of programmable logic devices (i.e., possible source devices) sold by Altera Corporation, of San Jose, Calif., the assignee hereof. Although an APEX® type architecture is shown, it will be understood that any type of PLD, CPLD (complex programmable logic device), or similar device may serve as a model for the base portion of the mask-programmable device, if desired.

As shown in FIG. 1, the logic resources include, at the most basic level, "logic elements" (LEs) 11, which may be, for example, look-up table-based logic regions having four inputs and the ability to have registered or unregistered outputs. Logic elements 11 may be grouped into "logic array blocks" (LABs) 12. In the embodiment shown, each LAB 12 includes ten LEs 11, although other numbers of LEs 11 could be grouped into each LAB 12. The LABs 12 may further be grouped into "groups of LABs" (GOLs) 13. In the embodiment shown, each GOL 13 includes seventeen LABs 12, although other numbers of LABs 12 could be grouped into each GOL 13. Each GOL 13 preferably also includes an embedded memory block (referred to in the embodiment shown as an "embedded system block" (ESB)) 14. Each GOL 13 may also include a plurality of gate array sites 15, which may be used, for example, for buffering, delaying, processing, and/or routing particular signals (described in more detail below).

Moreover, it will be understood that LABs 12 need not be organized in GOLs 13, but may be spread throughout base device 10 in regular or irregular patterns. Some of these resources may be external to the core logic array. The specific organization of LEs 11 and LABs 12 on base die 10 is not crucial to the invention.

As shown, GOLs 13 may be arranged in an orthogonal array of rows and columns. "Input/output elements" (I/Os) preferably are located in regions 16 around the periphery of the array. Other auxiliary circuits, such as "phase-locked loops" (PLLs) (e.g., for timing), preferably are provided at convenient locations within the array, such as in region 17, shown in about the center of the array.

The "architecture" (i.e., the overall organization) of mask-programmable base device 10 may be significantly different from that of a source device such as a source PLD. Although device 10 contains at least the same amount of logic resources (e.g., logic elements, phase-locked loops, I/O elements, etc.) as the source device on which it is based, most of these resources are modified to eliminate their programmability and to replace configuration-related logic with smart switches, and may be physically arranged and placed in different relative positions. For example, the PLLs that are usually located at the periphery of a source device are shown in FIG. 1 to be positioned in the middle of device 10 to improve noise immunity and optimize performance in the smaller mask-programmable device. The removal of the configuration-related logic, CRAM, and routing resources causes GOLs 13 to shrink more significantly in one dimension. To maintain a more square shaped device, which may be easier to manufacture and assemble than a long rectangular device, the above-described orthogonal array of rows and columns may be "folded over" such that it has twice as many rows and half as many columns as the source device (e.g., it may be twice as long in the x direction as compared to the y direction or vice versa). This arrangement may also result in a double column of I/O cells on each side of device 10, a significant difference from many source device I/O arrangements. Furthermore, not every logic resource available on the source device may be utilized in the user's design. The unused logic resource circuitry may be in its lowest current state, with its inputs tied off to power and ground planes to minimize leakage current and switch current. Therefore, better power performance may be obtained because only the used circuit blocks are implemented in the mask-programmed device. The unused logic resources may not be powered up even though they are available for a different design implementation on base device 10.

As mentioned above, base device 10 and the source device use substantially different interconnect schemes. Source devices, such as PLDs, traditionally have large numbers of general purpose routing conductors to provide routing flexibility and to ensure that the maximum amount of logic resources on the chip is utilized. Signals are routed on the chip by programming programmable logic connectors (multiplexers configured with SRAM cells in this case) to interconnect portions of logic circuitry on the PLD to obtain a specific circuit design. This type of arrangement is used to provide the "programmability" of the PLD so that it may accept a wide range of circuit designs. In complex PLDs, these routing resources take up a large portion of the die area. The majority of these fixed resources are often unused in any specific design and thus can be eliminated in mask-programmable base device 10. By building a customized interconnect network on each base device 10, a significant die size savings may be realized. This interconnect network may be implemented through mask programming of metallization layers added on top of the base device. Some of the benefits associated with the customized interconnect network include reduced die size and reduced internal capacitive loading compared to the source PLD.

Figure 2:
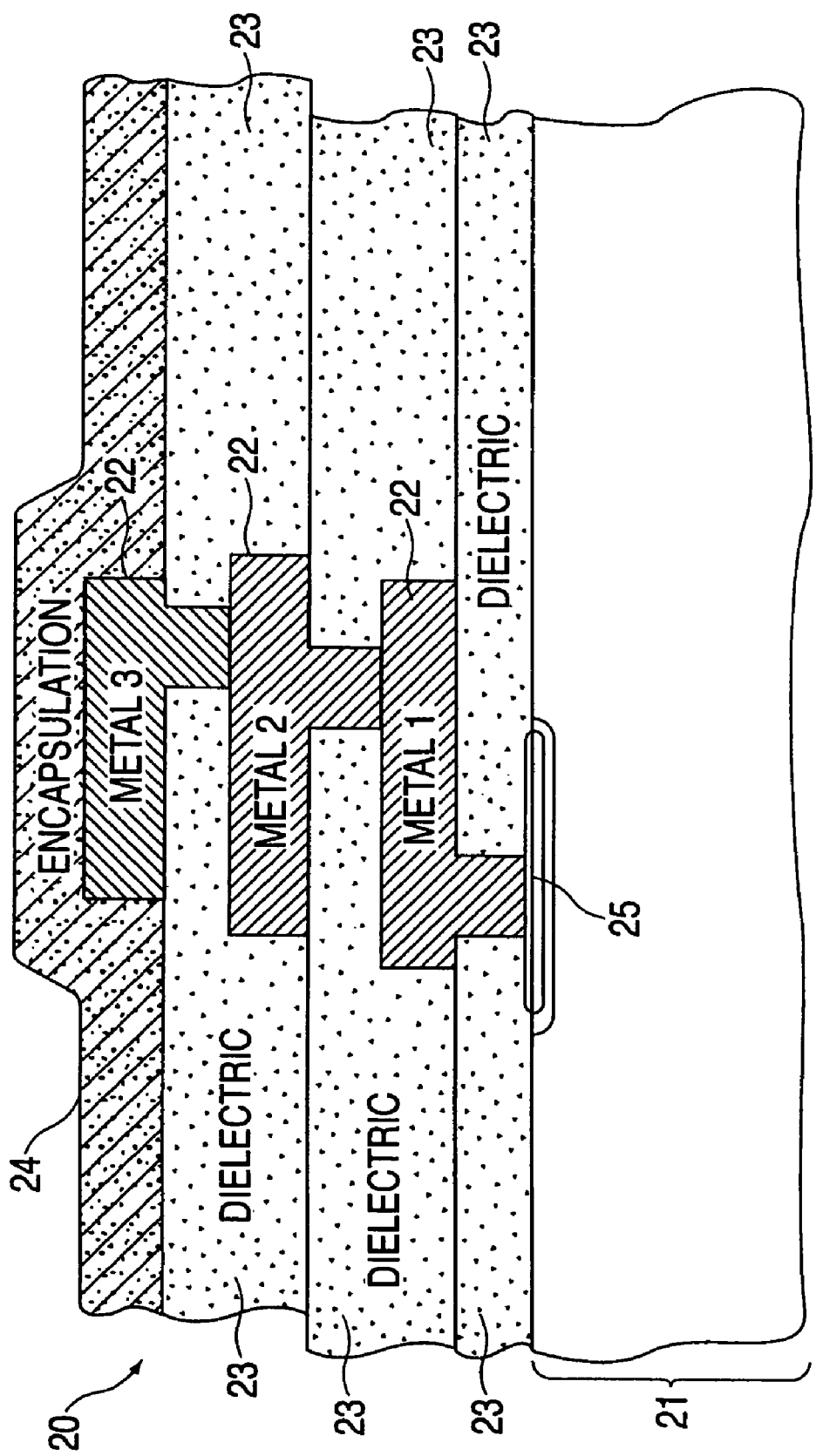
FIG. 2 is a cross-sectional view of the substrate and mask metallization layers of a mask-programmed device in accordance with the present invention, incorporating the device of FIG. 1.

FIG. 2 shows a cross-section of mask-programmable base device 10 after programming (i.e., after it has become a "mask-programmed" device 20), in which the substrate and other layers that make up the unprogrammed base device 10 are shown collectively at 21 (one transistor/switch 25 is shown as representative). Additional layers of metallization 22 and dielectric 23 are used to program device 20 and create a custom interconnect network that connects the resources included in base device 10. Commonly, an encapsulation layer 24 is provided to protect metallization and dielectric layers 22 and 23. Therefore, mask-programmed logic device 20 may be built on a mask-programmable base device 10 that has the same logic resources, memory, I/Os, and PLLs as the source device from which it was converted, yet does not necessarily have the same architecture as the source device. In some embodiments, however, the architecture may remain the same and be converted to mask-programmed device 20 by the methods described herein.

The conversion process of the present invention takes advantage of the fact that mask-programmable base device 10 has at least the same logic resources as its source device and it is not constrained by the prior location of these resources except to the extent that device 10 should be pin compatible and should meet the critical timing constraints of the source device.

Smart switches, which are configurable to facilitate, without transistors, the functionality of any configuration-related logic circuitry (i.e., circuitry whose functionality is dependant on at least one configuration-related CRAM value) of any logic resource, are provided on base device 10 of the present invention. These smart switches may be of various capabilities and may be used in a variety of ways throughout an MPLD to reduce its die area and power requirement while increasing its performance and yield. The type of smart switch employed to replace particular circuitry of logic resources may vary based on the functionality of that circuitry and the number of non-configuration-related values associated with that functionality, for example.

Figure 3:
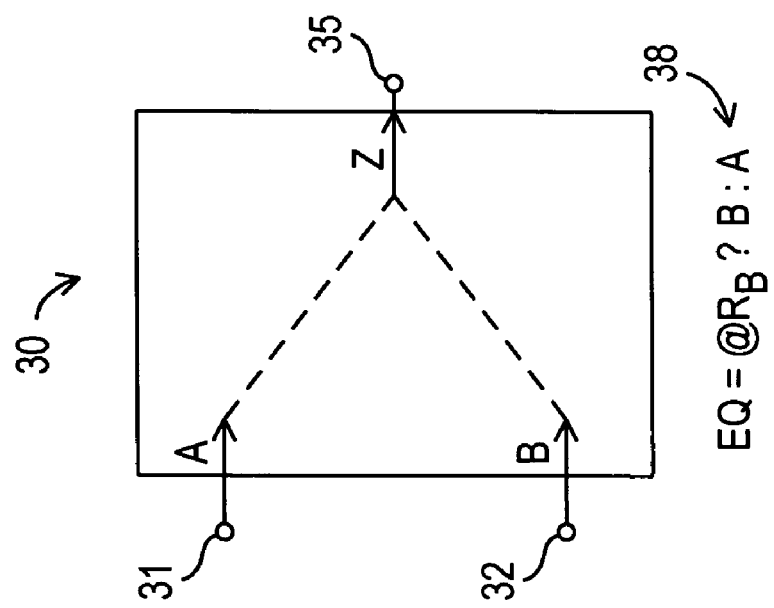
FIG. 3 is a block diagram illustrating one possible physical layout of a two-input smart switch with a standard two-input equation in accordance with the present invention.

In FIG. 3, a diagram illustrating one possible type of smart switch is shown. This "two-input" switch 30 may include a first input terminal 31 (contact pin A), a second input terminal 32 (contact pin B), and an output terminal 35 (contact pin Z). Two-input smart switch 30 may be considered to be "programmable" to the extent that interconnection conductors may be coupled to the contact pins within the switch. Such programmability allows a generic two-input smart switch 30 to form a "smart cell" with a specific function. The actual contents and size of each individual smart switch may vary depending on the type of configuration-related functionality it is intended to implement. Furthermore, it will be understood that several different types of smart switches (i.e., those with different contents and size) may be disposed throughout base device 10 to provide optimal die area reduction.

Each two-input switch 30 disposed on base device 10 may be defined by the same standard equation 38 built into its schematic that parametrically delineates how the connection between its terminals (i.e., its contact pins) is to be made (i.e., how the switch is to be programmed), regardless of the specific functionality to be implemented. Such an equation 38 contains a Boolean expression "place holder" ($@R_B$), which, when defined and evaluated, identifies whether a first of the two input terminals is to be connected to the output terminal or whether the second of the two input terminals is to be connected to the output terminal. Standard equation 38 can be expressed, for example, as follows:

$$EQ = @R_B ? B : A \qquad (1)$$

(i.e., "connect second input pin B to output pin Z if expression $@R_B$ is true, else connect first input pin A to output pin Z").

The place holder expression $@R_B$ for each two-input switch 30 may be individually derived from a Boolean function that defines the type of configuration-related logic being replaced by the switch and that depends on at least one configuration-related CRAM value provided to the manufacturer by the user regarding configuration of the logic being replaced (described in more detail below). Then, the interconnection of the contact pins of the switch may be determined by evaluating the derived place holder expression $@R_B$ using the at least one configuration-related CRAM value associated with that particular switch. Therefore, the smart switch is parameterizeable.

Figure 4:
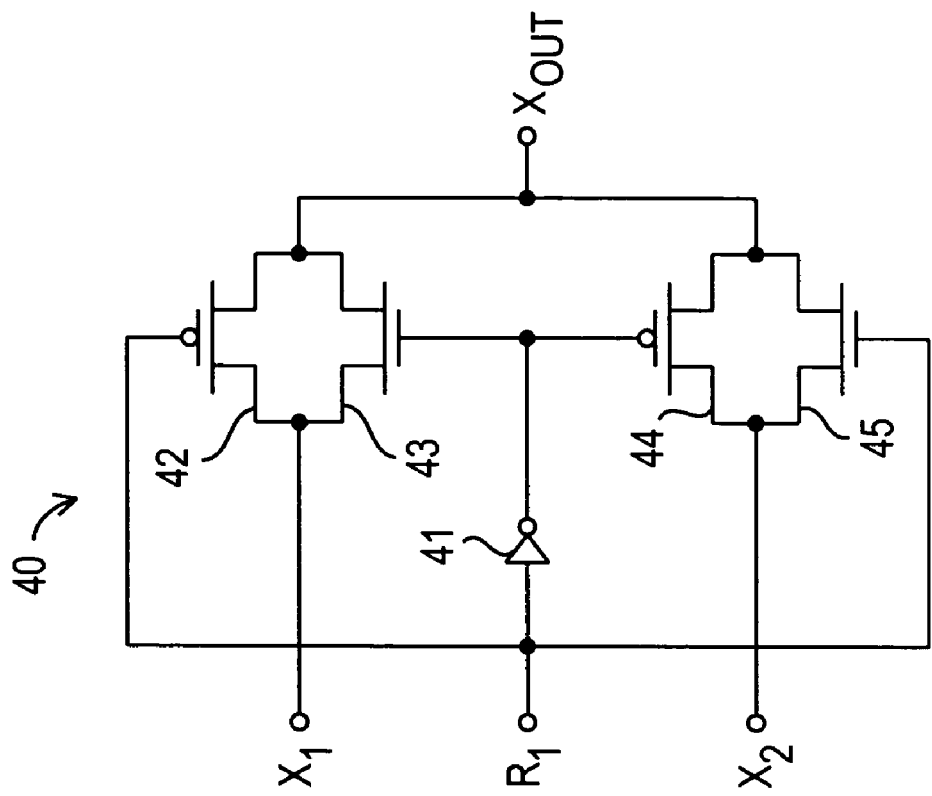
FIG. 4 is a schematic diagram of a particular arrangement of configuration-related logic circuitry illustrative of circuitry suitable for being replaced by the two-input smart switch of FIG. 3.

The contact pins of two-input smart switch 30 may be interconnected to obtain a smart cell with a desired function. Generally speaking, a smart cell is a programmed (configured) smart switch. FIG. 4 shows a particular arrangement 40 of configuration-related logic illustrative of typical circuitry found on a source PLD suitable for being replaced by a two-input smart switch 30 on mask-programmable base device 10. Circuitry 40 is a standard two-to-one multiplexer (MUX) including inverter 41 and transistors 42, 43, 44, and 45. Based on the logic value of a select signal $R_1$, either input signal $X_1$ or input signal $X_2$ is connected to the output $X_{OUT}$. This circuit realizes the following Boolean function 48:

$$X_{OUT} = \overline{R_1} \cdot X_1 + R_1 \cdot X_2 \qquad (2).$$

On a source PLD incorporating such a MUX 40 that is suitable for being replaced by a two-input switch 30, the select signal must be a static value "R" (i.e., $R_1$) defined by the user's configuration information (CRAM), whereas input signals $X_1$ and $X_2$ may each be either a static value "R" defined by CRAM or a non-configuration-related signal value "N" determined by the use of the device (e.g., clock signals, user signals provided to the device for computing, etc.). Along with being coupled respectively to contact pins A and B, each one of input terminals 31 and 32 of switch 30 is either coupled to the appropriate fixed logic value source (e.g., a power supply Vss for logic value "0" or a power supply Vds for logic value "1") if its corresponding input X is indeed a static CRAM value R, or to the appropriate interconnect signal line of the device if its corresponding input X is a non-configuration-related signal value N. It is to be understood, however, that a two-to-one MUX on a source PLD whose select signal is provided by a signal value N (i.e., not a CRAM value R) may not be replaced by a two-input switch 30 on base device 10, but may instead be easily replaced by another type of smart switch, as is described in more detail below with respect to FIGS. 11 and 12.

The Boolean expression of place holder $@R_B$ to define standard equation 38 of the two-input switch 30 replacing circuitry 40 may be derived from Boolean function 48 by determining what must be true for second input $X_2$ to be connected to output $X_{OUT}$. By determining that select input $R_1$ must be a logic value "1" for input $X_2$ to be connected to output $X_{OUT}$, $@R_B$ may be defined simply as "$R_1$, for example. Switch 30 may then be programmed to interconnect its contact pins by evaluating its standard equation 38, wherein $@R_B$ equals $R_1$, using the appropriate static value for $R_1$ as defined by the user's CRAM, as is described in more detail below with respect to FIGS. 13 and 14. Therefore, in this example, two-input smart switch 30 is able to replace configuration-related logic 40 on base device 10, thereby removing four transistors and an inverter from the base device.

Figure 4A:
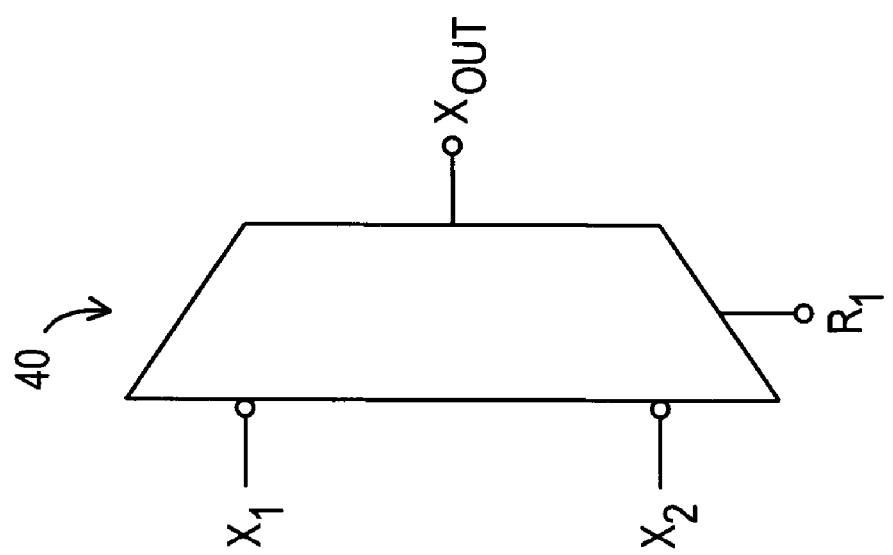
FIG. 4A is a block diagram representation of the arrangement of circuitry of FIG. 4.

FIG. 4A is a block representation of the two-to-one MUX shown in FIG. 4.

Figure 5:
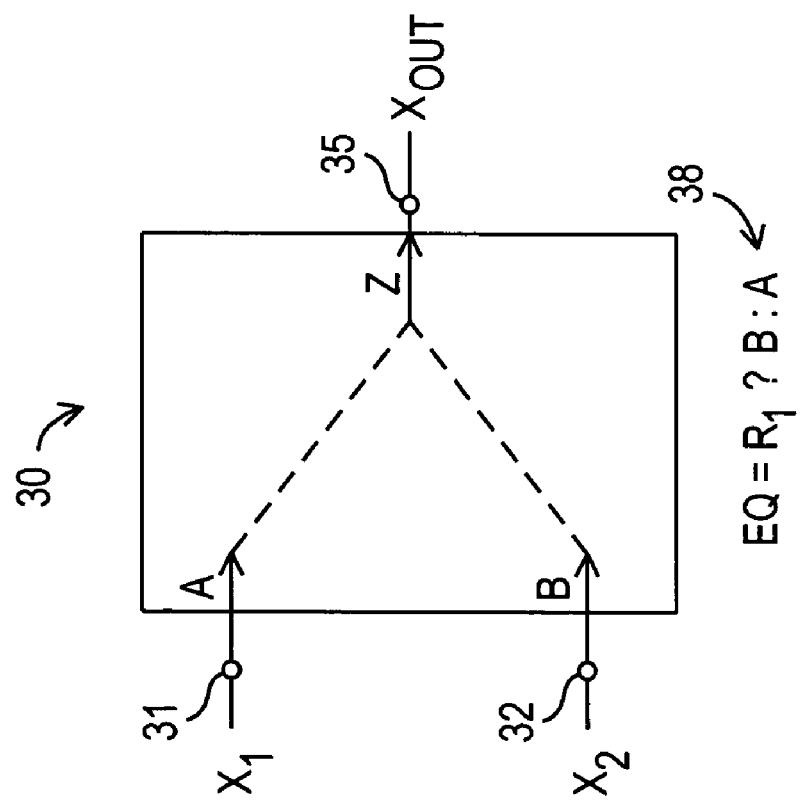
FIG. 5 is an updated block diagram illustrating one way of coupling the input terminals of the smart switch of FIG. 3 to signal sources and defining the place holder of the standard two-input equation of the smart switch of FIG. 3 to replace the arrangement of circuitry of FIGS. 4 and 4A in accordance with the present invention.

FIG. 5 is a diagram of smart-switch 30 with its terminals coupled to appropriate signal lines or logic value sources, and its standard equation 38 updated with an appropriate place holder expression, $@R_B$, such that the switch may replace two-to-one MUX circuitry 40 on base device 10.

It will be appreciated that the particular arrangement 40 of configuration-related logic shown in FIGS. 4 and 4A is merely illustrative, and that there are many other arrangements of configuration-related logic illustrative of typical circuitry found on a source PLD suitable for being replaced by a two-input smart switch 30 on mask-programmable base device 10. For example, switch 30 may be suitable to replace a wide range of configuration-related logic including, but not limited to, AND gates, OR gates, inverters, buffers, NOR gates, XOR gates, exclusive NOR gates, combinations thereof, etc. Moreover it will be understood that smart switches of the present invention can have any number of inputs, as will be described in more detail below, and can replace circuitry with any Boolean term that can be determined by the CRAM values. Furthermore, smart switches may be combined together to replace more advanced configuration-related logic circuitry such as flip-flops, registers, counters, delay elements, adders, and the like.

Figure 6:
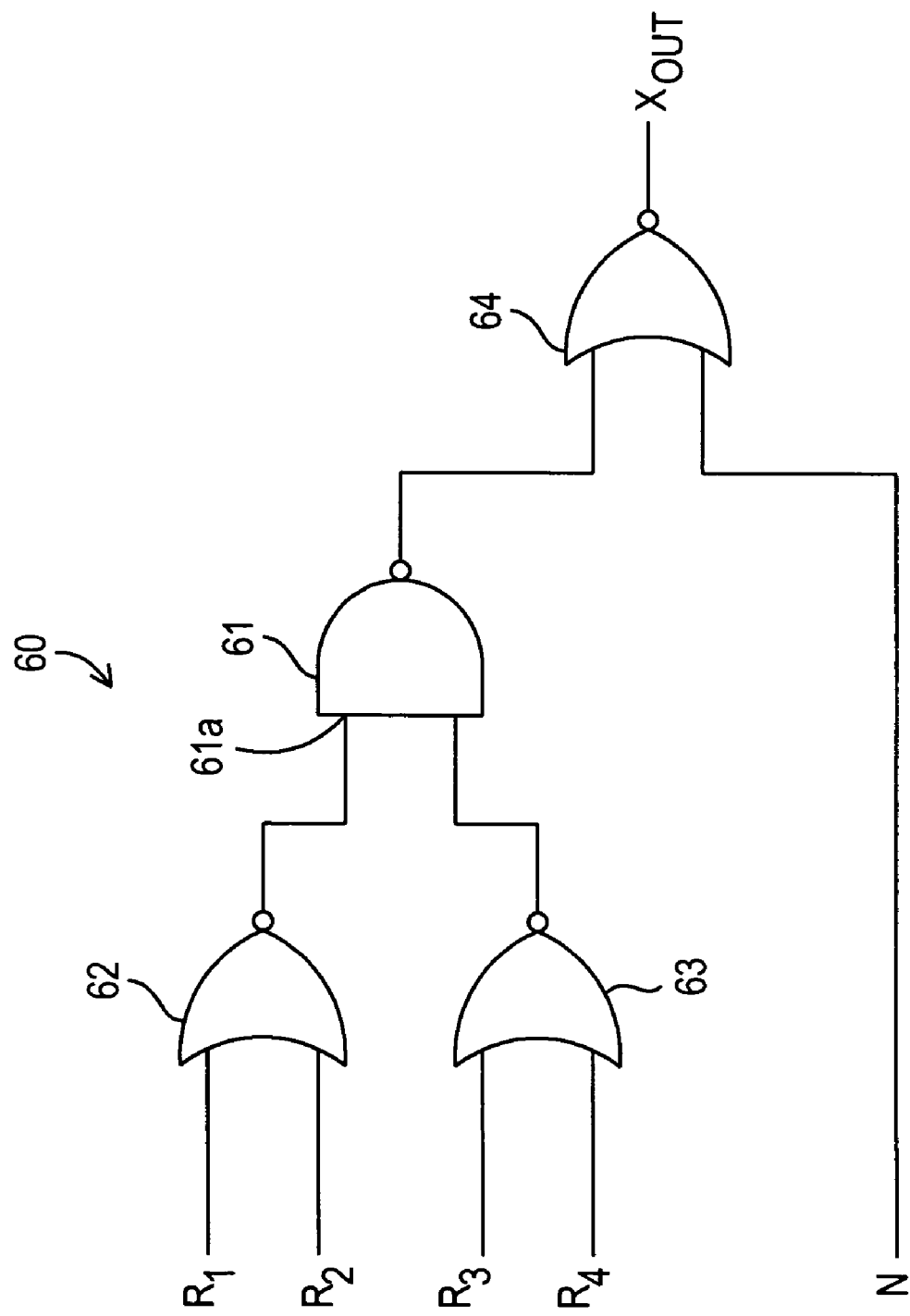
FIG. 6 is a logic symbol representation of another particular arrangement of configuration-related logic circuitry illustrative of circuitry suitable for being replaced by the two-input smart switch of FIG. 3.

An example of another particular arrangement 60 of configuration-related logic suitable for being replaced by a two-input smart switch 30 on mask-programmable base device 10 is shown in FIG. 6. The specific two-input switch 30 to replace circuitry 60 and the switch 30 to replace circuitry 40 may vary from one another only with respect to the Boolean expression that defines place holder $@R_B$ in standard equation 38 of the switch, and with respect to the types of external connections made to the terminals of the switch (i.e., at its terminals 31, 32, and 35).

As shown in FIG. 6, circuitry 60 includes a long chain of logic often used in column address decoders of source PLDs, for example. Circuitry 60 includes NAND gate 61, and NOR gates 62, 63, and 64, each of which includes four transistors and an inverter (not shown). While gate 62 may simply be replaced by coupling input 61a of gate 61 to the appropriate fixed logic value source (e.g., Vss or Vds) based on evaluating the NOR functionality of gate 62 with the CRAM values of its inputs $R_1$ and $R_2$, for example, it is also possible to replace all of circuitry 60 with a single smart switch 30. By analyzing the functionality of circuitry 60, it is realized that either a logic value "0" or the complement of input N is connected to the output $X_{OUT}$, based on the logic values of inputs $R_1$, $R_2$, $R_3$, and $R_4$. This circuit realizes the following Boolean function 68:

$$X_{OUT} = \overline{R_1} \cdot \overline{R_2} \cdot \overline{R_3} \cdot \overline{R_4} \cdot \overline{N} \quad (3).$$

A source of a logic value "0" (e.g., Vss) may be fixed to first input terminal 31 of switch 30, and the complement of non-configuration-related value N (i.e., $\overline{N}$) may be coupled to second input terminal 32 using inverter 33 (FIG. 7), because there is only one logic signal value N provided as an input to circuitry 60. The Boolean expression of place holder $@R_B$ to define standard equation 38 of the two-input switch 30 replacing circuitry 60 may be derived from Boolean function 68 by determining what must be true for second input $\overline{N}$ to be connected to output $X_{OUT}$. By determining that each of select inputs $R_1$–$R_4$ must be a logic value "0" for the complement of input N to be connected to output $X_{OUT}$, $@R_B$ may be defined as "$\overline{R_1} \cdot \overline{R_2} \cdot \overline{R_3} \cdot \overline{R_4}$," for example. Switch 30 may then be programmed to interconnect its contact pins by evaluating its standard equation 38, wherein $@R_B$ equals $\overline{R_1} \cdot \overline{R_2} \cdot \overline{R_3} \cdot \overline{R_4}$, using the appropriate static values for $R_1$–$R_4$ as defined by the user's CRAM, as is described below in more detail with respect to FIGS. 13 and 14. Therefore, in this example, two-input smart switch 30 is able to replace configuration-related logic 60 on base device 10, thereby removing sixteen transistors and three inverters from the base device.

Figure 7:
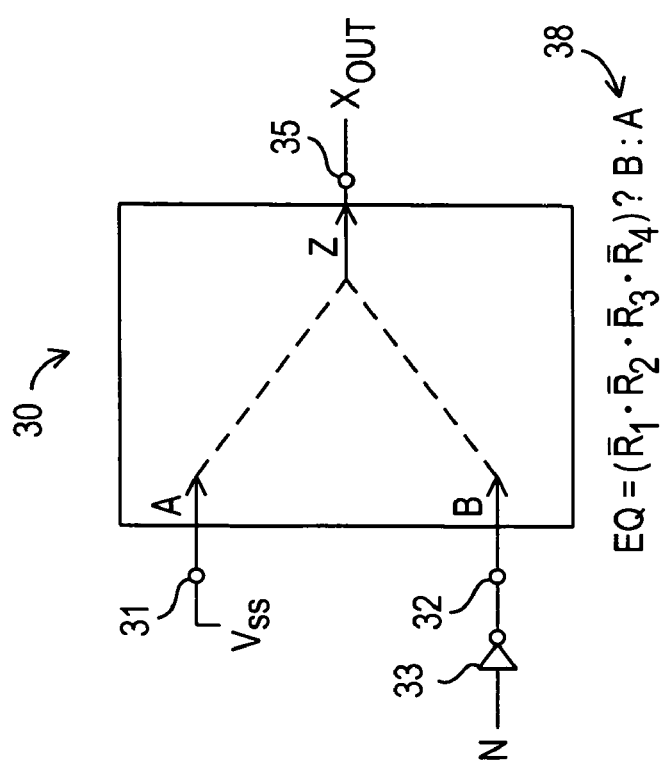
FIG. 7 is an updated block diagram illustrating one way of coupling the input terminals of the smart switch of FIG. 3 to signal sources and defining the place holder of the standard two-input equation of the smart switch of FIG. 3 to replace the arrangement of circuitry of FIG. 6 in accordance with the present invention.

FIG. 7 is a diagram of smart-switch 30 with its terminals coupled to appropriate signal lines or logic value sources, as described above, and its standard equation 38 updated with an appropriate place holder expression $@RB$, such that the switch may replace circuitry 60 on base device 10.

Figure 8:
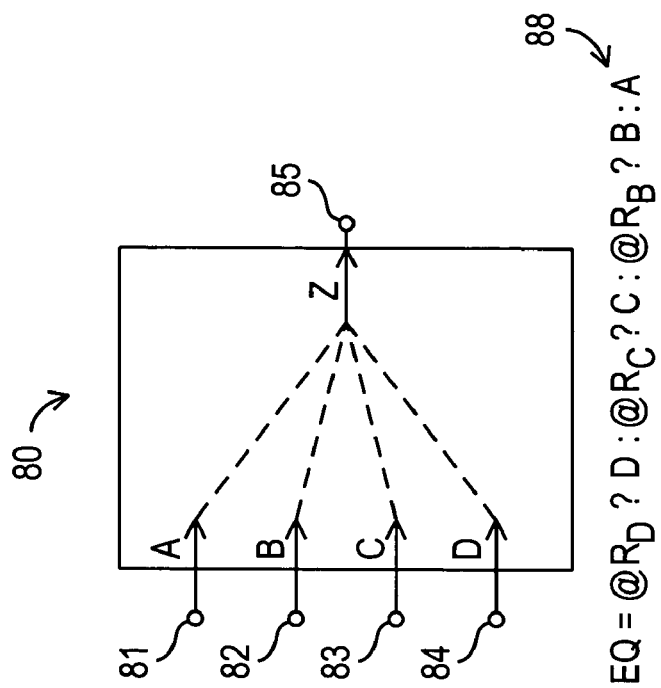
FIG. 8 is a block diagram illustrating one possible physical layout of a four-input smart switch with a standard four-input equation in accordance with the present invention.

It will be appreciated that the particular two-input type of smart switch 30 shown in FIGS. 3, 5, and 7 is merely illustrative, and that there are many other types of smart switch that may be used to replace configuration-related logic of a source PLD on mask-programmable base device 10. For example, a diagram illustrating another possible type of smart switch is shown in FIG. 8. This "four-input" switch 80 may contain a first input terminal 81 (contact pin A), a second input terminal 82 (contact pin B), a third input terminal 83 (contact pin C), a fourth input terminal 84 (contact pin D), and an output terminal 85 (contact pin Z). Like switch 30, four-input smart switch 80 may be considered to be "programmable" to the extent that interconnection conductors may be coupled to the contact pins within the switch.

Each four-input switch 80 disposed on base device 10 may be defined by the same standard equation 88 built into its schematic that parametrically delineates how the connection between its terminals (i.e., its contact pins) is to be made, regardless of the specific functionality to be implemented. Such an equation 88 contains three Boolean expression place holders, $@R_D$, $@R_C$, and $@R_B$, which, when defined and evaluated, identify whether a first, second, third, or fourth of the four input terminals is to be connected to the output terminal of the switch. Standard equation 88 can be expressed, for example, as follows:

$$EQ = @R_D ? D : @R_C ? C : @R_B ? B : A \quad (4)$$

(i.e., "connect fourth input pin D to output pin Z if expression $@R_D$ is true, connect third input pin C to output pin Z if expression $@R_C$ is true, connect second input pin B to output pin Z if expression $@R_B$ is true, else connect first input pin A to output pin Z").

Each one of place holder expressions $@R_{D-B}$ for each four-input switch 80 may be individually derived from a Boolean function that defines the type of configuration-related logic being replaced by the switch and that depends on at least one configuration-related CRAM value regarding configuration of the logic being replaced. Then, the interconnection of the contact points of the switch may be determined by evaluating the derived place holder expressions $@R_{D-B}$ using the at least one configuration CRAM value associated with that particular switch. Therefore, like switch 30, smart switch 80 is parameterizeable.

Figure 9:
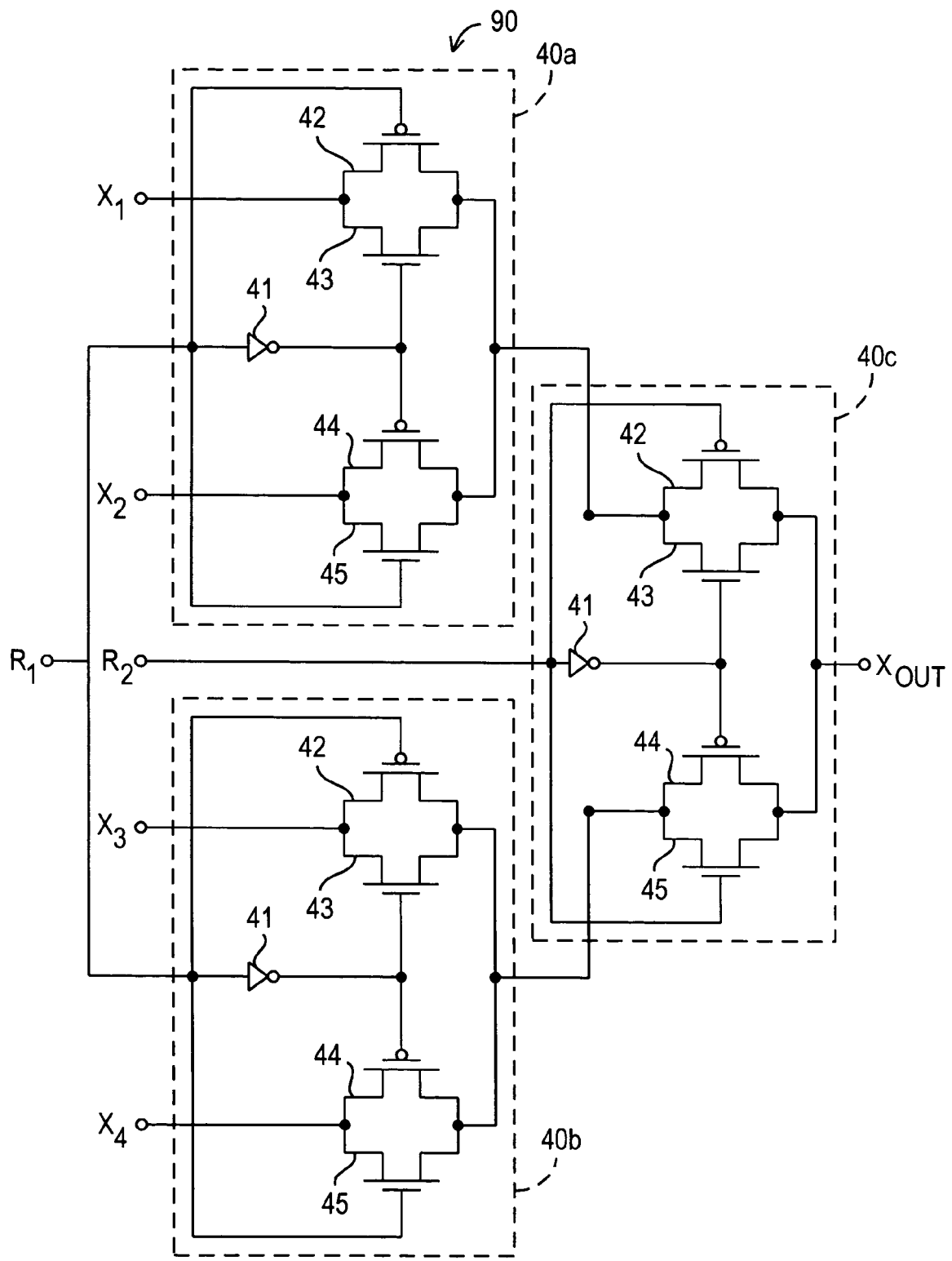
FIG. 9 is a schematic diagram of a particular arrangement of configuration-related logic circuitry illustrative of circuitry suitable for being replaced by the four-input smart switch of FIG. 8.

FIG. 9 shows a particular arrangement 90 of configuration-related logic illustrative of typical circuitry found on a source PLD suitable for being replaced by a four-input smart switch 90 on mask-programmable base device 10. Circuitry 90 is a standard four-to-one multiplexer (MUX) consisting of a combination of three standard two-to-one MUXs 40a, 40b, and 40c, which may be similar to MUX 40 of FIGS. 4 and 4A). MUXs 40a, 40b, and 40c each include an inverter 41 and transistors 42, 43, 44, and 45. Based on the logic values of select signals $R_1$ and $R_2$, either input signal $X_1$, $X_2$, $X_3$, or $X_4$ is connected to the output $X_{OUT}$. This four-to-one MUX circuit 90 realizes the following Boolean function 98:

$$X_{OUT} = \overline{R_1} \cdot \overline{R_2} \cdot X_1 + R_1 \cdot \overline{R_2} \cdot X_2 + \overline{R_1} \cdot R_2 \cdot X_3 + R_1 \cdot R_2 \cdot X_4 \quad (5).$$

On a source PLD incorporating such a four-to-one MUX 90 that is suitable for being replaced by a four-input switch 30 on base device 10, the select signals must be static values "R" (i.e., $R_1$ and $R_2$) defined by the user's configuration information, whereas inputs $X_1$, $X_2$, $X_3$, and $X_4$ may each be either a static value "R" defined by CRAM or a non-configuration-related signal value "N" determined by the use of the device. Along with being coupled respectively to contact pins A–D, each one of input terminals 81–84 of switch 80 is either coupled to the appropriate fixed logic value source if its corresponding input $X_{1-4}$ is indeed a static CRAM value R, or to the appropriate interconnect signal line of the device if its corresponding input $X_{1-4}$ is a non-configuration-related signal value N.

The Boolean expression of each of place holders $@R_{D-B}$ to define standard equation 88 of the four-input switch 80 replacing circuitry 90 may be derived from Boolean function 98 by determining what must be true for each of inputs $X_{1-4}$ to be connected to output $X_{OUT}$. By determining that select input $R_1$ and select input $R_2$ must each be a logic value "1" for input $X_4$ to be connected to output $X_{OUT}$, that select input $R_1$ must be a logic value "0" and select input $R_2$ must be a logic value "1" for input $X_3$ to be connected to output $X_{OUT}$, that select input $R_1$ must be a logic value "1" and select input $R_2$ must be a logic value "0" for input $X_2$ to be connected to output $X_{OUT}$, and that select input $R_2$ and select input $R_2$ must each be a logic value "0" for input $X_1$ to be connected to output $X_{OUT}$, $@R_D$ may be defined as "$\mp R_1 \cdot R_2$," $@R_C$ may be defined as "$\overline{R_1} \cdot R_2$," and $@R_B$ may be defined as "$R_1 \cdot \overline{R_2}$," for example. Switch 80 may then be programmed to interconnect its contact points by evaluating its standard equation 88 having these $@R_{D-B}$ expressions using the appropriate static values for $R_1$ and $R_2$, as defined by the user's CRAM, as is described in more detail below with respect to FIGS. 13 and 14. Therefore, in this example, four-input smart switch 80 is able to replace configuration-related logic 90, thereby removing twelve transistors and three inverters from the base device.

Figure 10:
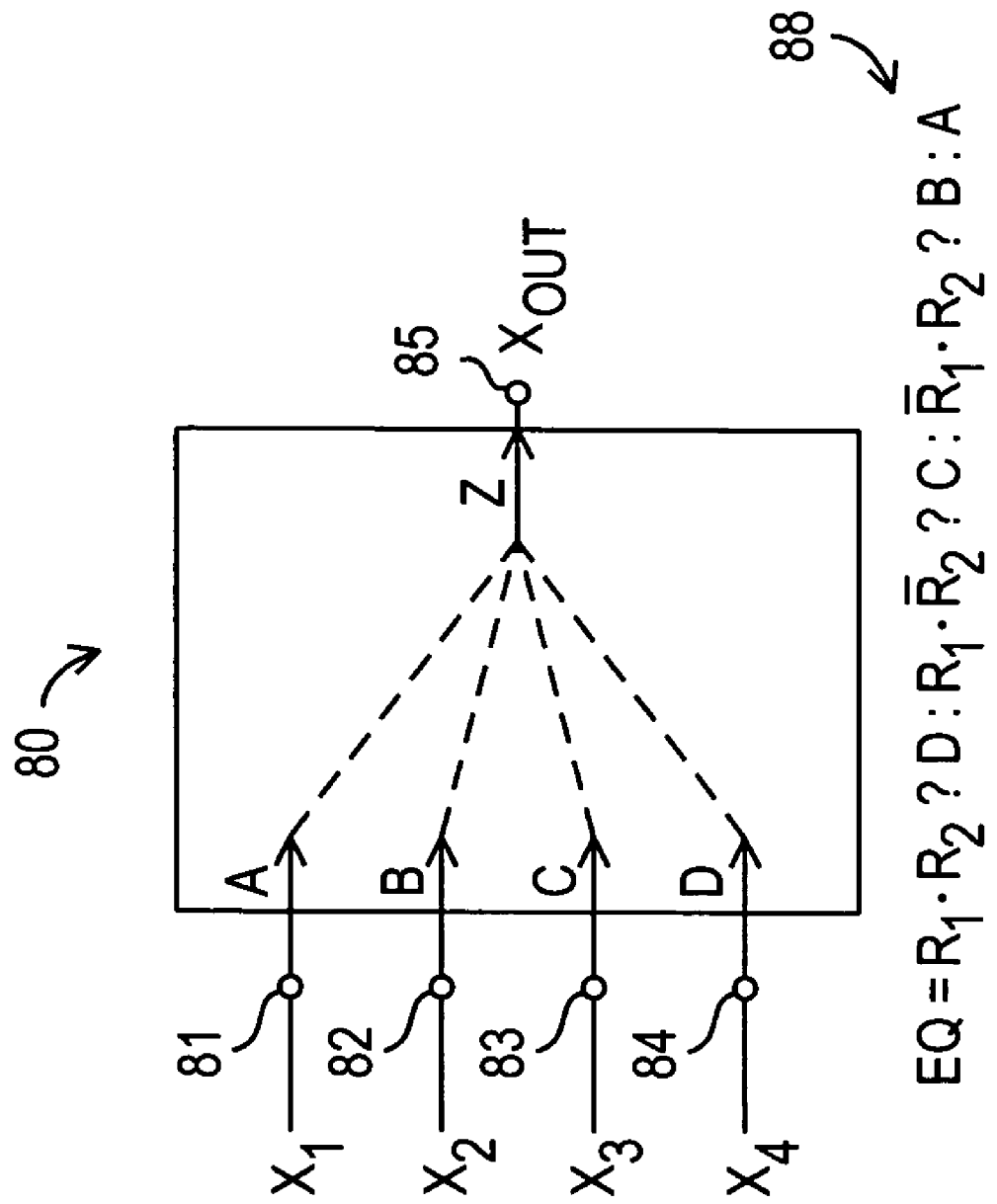
FIG. 10 is an updated block diagram illustrating one way of coupling the input terminals of the smart switch of FIG. 8 to signal sources and defining the place holders of the standard four-input equation of the smart switch of FIG. 8 to replace the arrangement of circuitry of FIG. 9 in accordance with the present invention.

FIG. 10 is a diagram of smart-switch 80 with its terminals coupled to appropriate signal lines or logic value sources, and its standard equation 88 updated with appropriate place holder expressions @$R_{D-B}$, such that the switch may replace four-to-one MUX circuitry 90 on base device 10.

Figure 11:
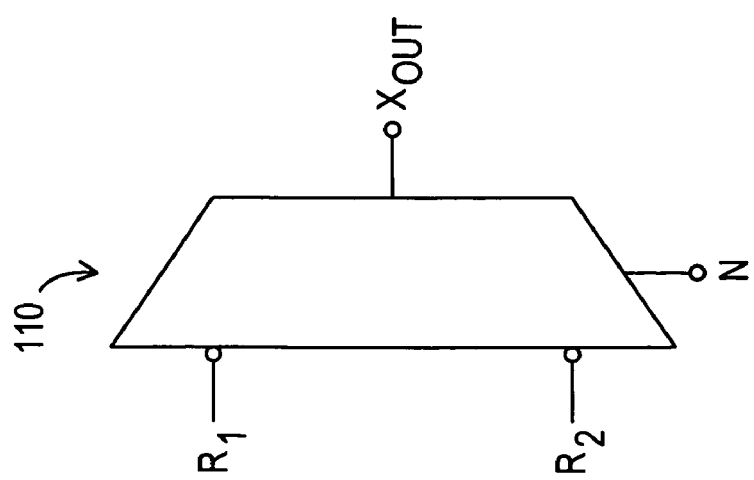
FIG. 11 is a block diagram representation of another particular arrangement of configuration-related logic circuitry illustrative of circuitry suitable for being replaced by the four-input smart switch of FIG. 8.

It will be appreciated that the particular arrangement 90 of configuration-related logic shown in FIG. 9 is merely illustrative, and that there are many other arrangements of configuration-related logic illustrative of typical circuitry found on a source PLD suitable for being replaced by a four-input smart switch 80 on mask-programmable base device 10. For example, another particular arrangement of such circuitry is shown in FIG. 11. Circuitry 110 is a standard two-to-one multiplexer similar to MUX 40 shown in FIGS. 4 and 4A. However, unlike MUX 40 which is controlled by a select input R (i.e., a CRAM value), two-to-one MUX 110 is controlled by a select input N (i.e., a non-configuration-related signal value determined by the use of the device). This type of configuration-related logic may be used to provide part of a look-up table (LUT) in an LE 11, for example. The logic inputs of a LUT act as address lines to the LUT's 16-bit programmable memory (e.g., sixteen CRAM values), whose contents define the logic function of the LUT, using an array of configuration-related logic (e.g., multiplexers (MUXs), fuses, transistors, etc.). Based on the logic value of select input N, either input $R_1$ or input $R_2$ is connected to the output $X_{OUT}$. This circuit realizes the following Boolean function 118:

$$X_{OUT}=\overline{N} \cdot R_1 + N \cdot R_2 \qquad (6).$$

On a source PLD incorporating such a MUX 110 that is suitable for being replaced by a four-input switch 80 on base device 10, inputs $R_1$ and $R_2$ must be static values "R" defined by CRAM. Along with being coupled respectively to contact pins A–D, each one of input terminals 81–84 of switch 80 is either connected to an appropriate fixed logic value source (e.g., a power supply Vss or power supply Vds) or an appropriate signal line of the device, as described in more detail below.

Figure 12:
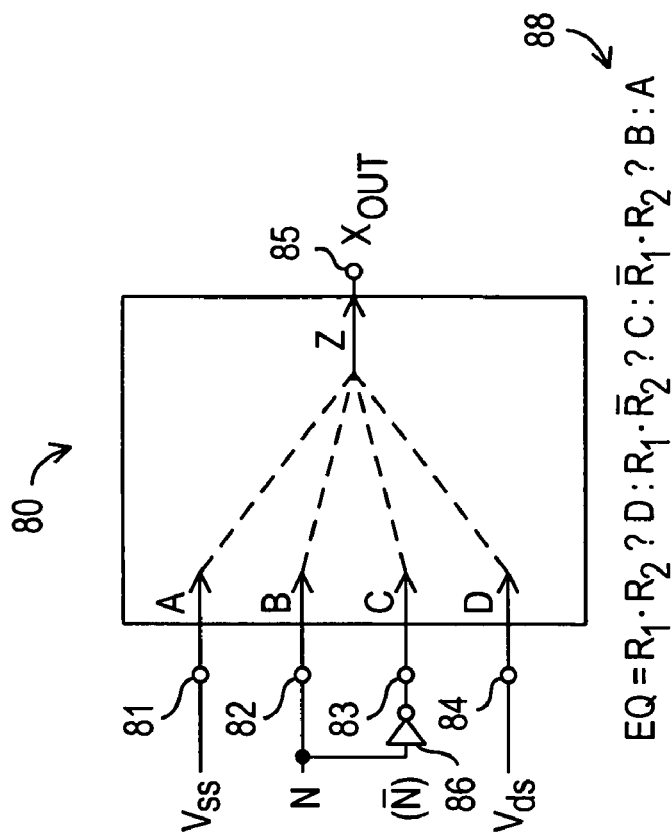
FIG. 12 is an updated block diagram illustrating one way of coupling the input terminals of the smart switch of FIG. 8 to signal sources and defining the place holders of the standard four-input equation of the smart switch of FIG. 8 to replace the arrangement of circuitry of FIG. 11 in accordance with the present invention.

The Boolean expression of place holders @$R_{D-B}$ to define standard equation 88 of the four-input switch 80 replacing circuitry 110 may be derived from Boolean function 118 by determining what must be true of inputs R for a particular signal to be provided by output $X_{OUT}$. By determining that $X_{OUT}$ will provide a logic value "1" regardless of the value of select input N when inputs $R_1$ and $R_2$ are each a logic value "1," that $X_{OUT}$ will provide a logic value equal to the complement of the logic value of N when input $R_1$ is a logic value "1" and input $R_2$ is a logic value "0," that $X_{OUT}$ will provide a logic value equal to the logic value of N when input $R_1$ is a logic value "0" and input $R_2$ is a logic value "1," and that $X_{OUT}$ will provide a logic value "0" regardless of the value of select input N when inputs $R_1$ and $R_2$ are each a logic value "0," @$R_D$ may be defined as "$R_1 \cdot R_2$," @$R_C$ may be defined as "$\overline{R_1} \cdot R_2$," and @$R_B$ may be defined as "$R_1 \cdot \overline{R_2}$," for example. Switch 80 may then be programmed to interconnect its contact pins by evaluating its standard equation 88 having these @$R_{D-B}$ expressions using the appropriate static values for $R_1$ and $R_2$, as defined by the user's CRAM, as is described in more detail below with respect to FIGS. 13 and 14. However, in order for this programmed smart-switch 80 to fully realize the functionality of MUX circuitry 110, input terminal 81 must be coupled to a fixed source of logic value "0" (e.g., power supply Vss), input terminal 84 must be coupled to a fixed source of logic value "1" (e.g., power supply Vds), input terminal 82 must be coupled to the signal line of the device that provides signal N, and input terminal 83 must be coupled to the signal line that provides the complement of signal N using inverter 86 (FIG. 12). It is to be understood, however, that if the terminals of switch 80 are coupled to signal sources differently than as described above, it may be necessary to redefine the Boolean expressions of place holders @$R_{D-B}$. Therefore, in this example, four-input smart switch 80 is able to replace configuration-related logic 110.

FIG. 12 is a diagram of smart-switch 80 with its terminals coupled to appropriate signal lines, and its standard equation 88 updated with appropriate place holder expressions @$R_{D-B}$, such that the switch may replace two-to-one MUX circuitry 110 on base device 10.

The configuration-related logic circuitry arrangements of FIGS. 4, 4A, 6, 9, and 11 are merely illustrative, and that there are many other arrangements of configuration-related logic illustrative of circuitry found on a source PLD suitable for being replaced by smart switches of the present invention without departing from the spirit and scope of the present invention.

From the foregoing, it is to be understood that the standard equation for an N-input smart switch may be generally expressed, for example, as follows:

$$EQ=@R_N?N:@R_{N-1}: \ldots :@R_B?B:A \qquad (7).$$

The place holders @$R_{N-B}$ for each N-input switch may be individually defined by a Boolean expression derived from the arrangement of configuration-related logic circuitry being replaced by the switch, and the switch may be programmed through evaluation of the equation, updated with the appropriate place holder expressions, using the CRAM values associated with the circuitry.

However, it is to be understood that the functionality of a smart switch is not defined only by the place holder expressions of its standard equation, but also by the types of signal lines coupled to its input terminals. For example, while the place holder expressions for standard equation 88 are shown to be the same for switch 80 regardless of whether the switch is to replace a four-to-one MUX (see, e.g., FIG. 10) or a two-to-one MUX controlled by a logic signal value N (see, e.g., FIG. 12), input terminals 81–84 are coupled to signal lines differently, according to the type of configuration-related logic circuitry of the source device it is replacing on the base device. This routing of signals to and from the terminals of smart switches on a device is preferably done in conjunction with the routing of all interconnections on the device, while taking into account the type of configuration-related logic the switch is replacing, as is described in more detail below with respect to FIGS. 13 and 14.

Figure 13:
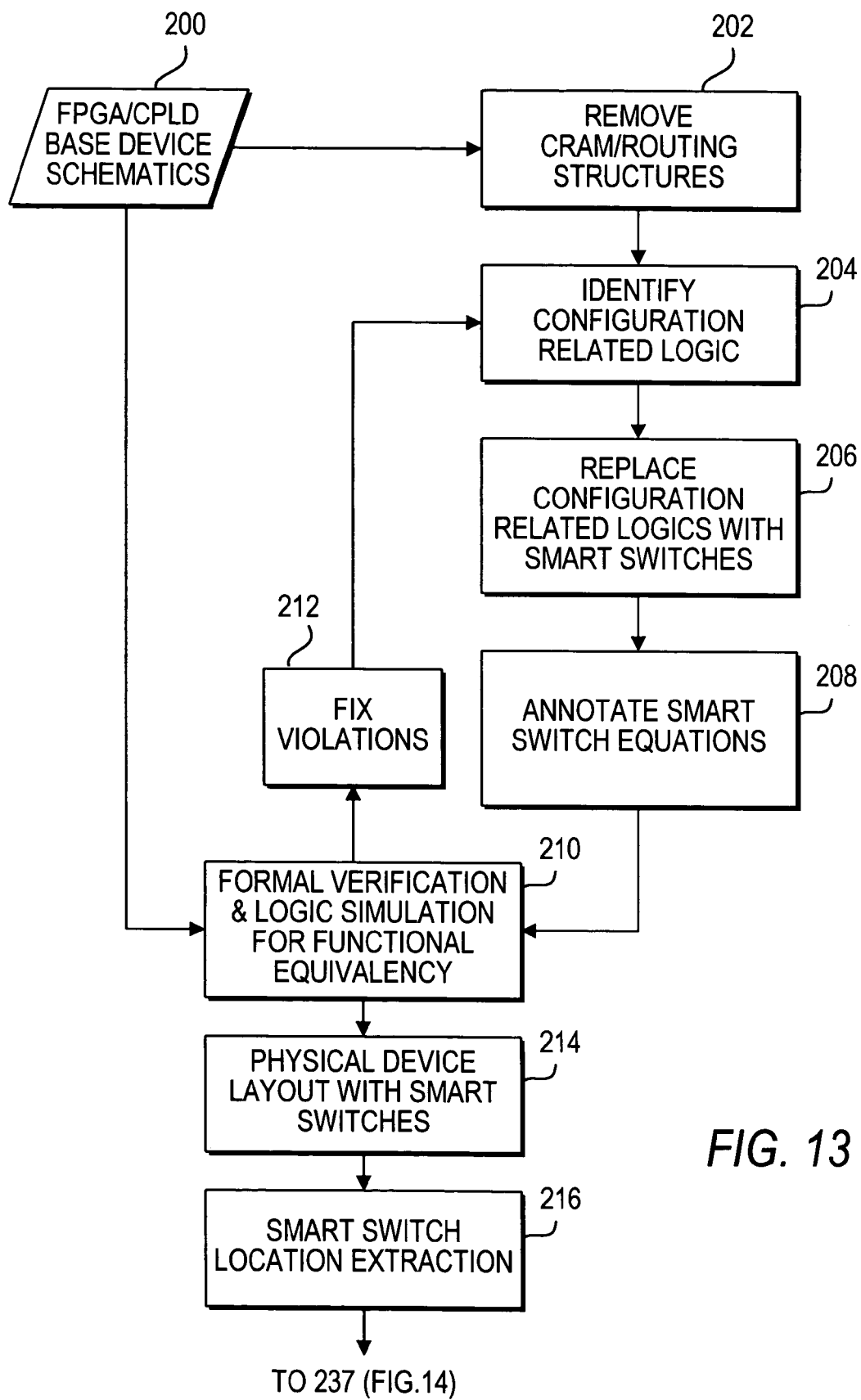
FIG. 13 is a flow chart illustrating some of the steps involved in creating a mask-programmable base device from a source PLD base device in accordance with the present invention.

FIG. 13 shows a conversion flow diagram illustrating some of the steps involved in producing mask-programmable base device 10 from a source PLD base device in accordance with the present invention. This process does not rely on any user-supplied configuration information. Initially, the schematic information of the base device of the PLD is provided to the manufacturer at step 200. Schematic information may be supplied about the source base device, such as a PLD, in a computer generated file generated by Altera's proprietary software. As in previously known methods, the CRAM and routing structures of the source device are removed at step 202.

Next, at step 204, the schematic information of the source base device may be scanned to identify configuration-related logic that may be replaced by smart-switches of the present invention on mask-programmable base device 10. Such configuration-related logic may be any type of circuitry whose functionality is dependant on at least one configuration-related CRAM value, such as circuitry 40, 60, 90, and 110 shown in FIGS. 4, 6, 9, and 11, for example. Each configuration-related logic circuitry of the source base device identified in the schematic information at step 204 is replaced in the schematic information of mask-programmable base device 10 with a standard equation for an appropriately sized smart-switch with the appropriate place holder expressions using internally-developed software at step 206. As described above, Boolean expressions of the place holders of the standard equation of a smart-switch may be derived by evaluating the functionality of the configuration-related logic circuitry to be replaced.

Once the smart-switch equations are properly defined at step 206, a simulation database annotates each equation at step 208 with the most common, if not all, of the sets of CRAM values that may possibly be defined by a user to determine how the switch is programmed. For each of the sets of CRAM values annotated at step 208, the integrity of the equation may be verified through static functional verification techniques that involve confirming that two versions of a design are functionally identical when certain constraints are applied (step 210). For example, each smart-switch equation derived at step 206 should be logically equivalent to the configuration-related logic of the source device that the switch is replacing. This technique does not rely on any user-supplied simulation vectors. If the annotated equation is not found to be functionally identical to the configuration-related logic, then appropriate corrections are implemented in the equation at step 212 to ensure functional equivalence by reiterating steps 204–208 until a satisfactory smart-switch equation is produced.

At this point, the derivation of smart-switch equations is complete. At step 214, the physical representation of the smart-switches with the appropriate equations are entered into the schematic of mask-programmable base device 10. At step 216, the location of each smart-switch on base device 10 is extracted based on the location on the source PLD base device of the configuration-related logic being replaced.

Figure 14:
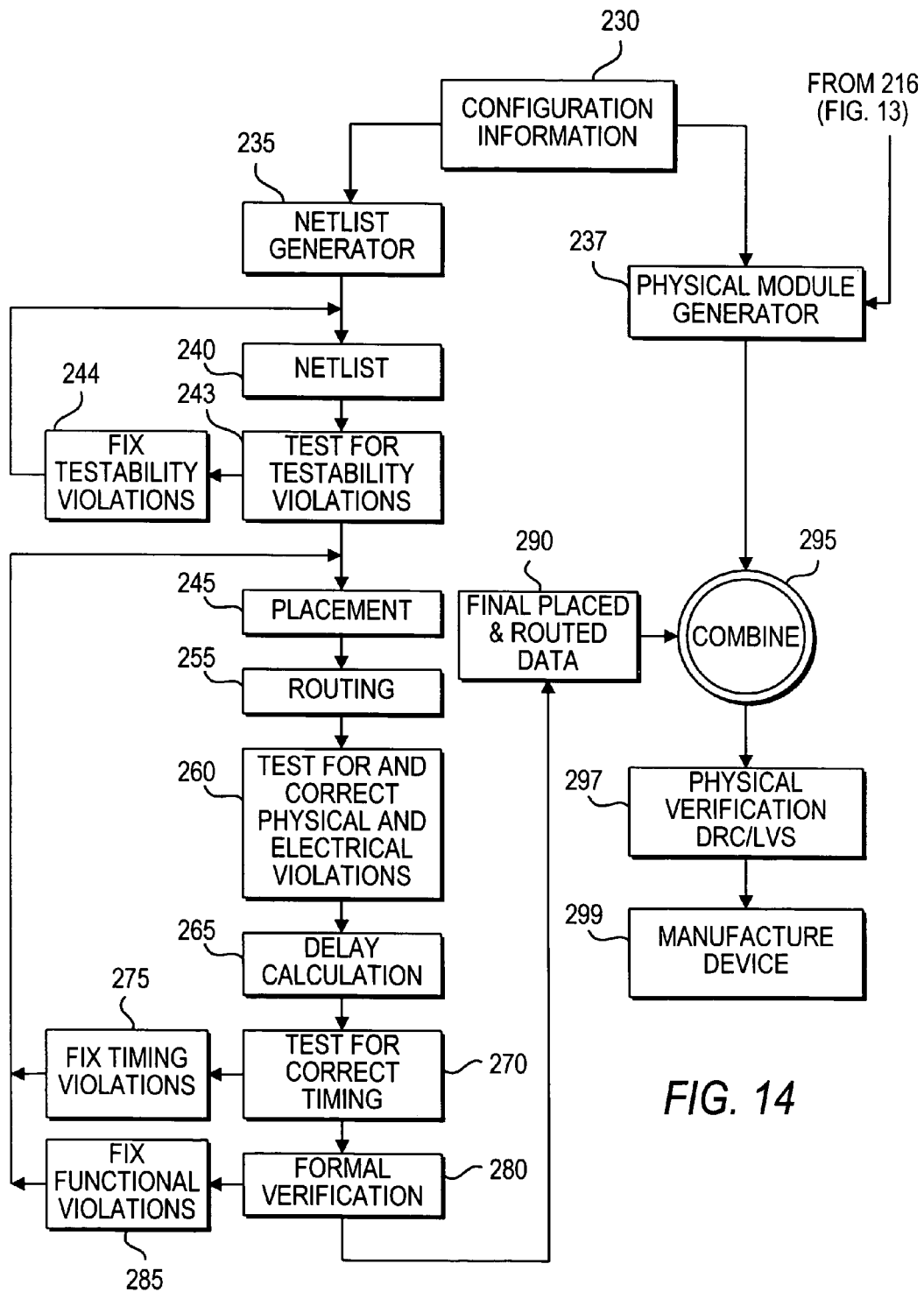
FIG. 14 is a flow chart illustrating some of the steps involved in converting a PLD source device into a mask-programmed device on the mask-programmable base device created in FIG. 13 in accordance with the present invention.

FIG. 14 shows a conversion flow diagram for the above-mentioned method of producing mask-programmed logic device 20 on base device 10 from a pre-existing circuit design using a user's design specification. Initially, the user provides the manufacturer with information regarding configuration and the desired timing requirements of the source device (step 230). Configuration information may be supplied about the source device, such as a PLD, in a computer generated configuration file such as an SRAM Object File (.sof file) generated by Altera's Quartus® II software. This file typically includes both connectivity information and information about the physical configuration of logic resources. The configuration file is provided to a netlist generator at step 235 and a physical module generator at step 237. Connectivity information contained in the configuration file is extracted by the netlist generator and a structural netlist 240 such as a Verilog® netlist is created. Netlist 240 contains information describing both the logic function and connectivity of the source device, but preferably does not retain information relating to the physical placement of logic resources.

Next, at step 243, netlist 240 may be scanned for testability violations. At this point, test structures may be added to correct any detected violations, to allow for fault testing, and to provide further visibility into the operation of the completed mask-programmed device 20 (step 244). Steps 243 and 244 may be repeated until all testability violations are corrected.

At step 237, the physical module generator determines how to physically configure the logic resources on base device 10, such as LEs 11, so that they perform required logic functions. This step takes the physical layout of each base device 10, such as LEs 11 and its smart-switch locations and equations from step 216 of FIG. 13, and physically programs the smart-switches based on the evaluated values of the switches' associated CRAM from the configuration information provided at step 230. In some embodiments, this operation may be based on the configuration bits (CRAM) provided by the configuration file at step 230. This may be thought of as the first step of physically programming device 10 (i.e., determining how to connect the logic resources and their switches to produce the desired logic functions). The functionality and physical integrity of these "programmed modules" may be verified as they are generated, therefore, a logic simulation verifying the functionality of the modules may not be needed. Step 237 is typically performed concurrently with steps 235–280.

Information in netlist 240 describes the function of each circuit block on the source device (e.g., I/O, LE, ESB, and PLL blocks in a PLD) and how each block is connected to other circuit blocks. At step 245, a placement routine assigns specific portions of the source device's design to particular portions of base device 10. Placement of logic resources (e.g., LABs 12) may be based on a variety of factors such as constraints imposed by interconnection requirements, timing requirements, and by pin compatibility with the source device. One purpose of the placement routine is to optimize the location of logic resources on mask-programmed device 20 to ensure its performance characteristics are equal to or better than those achieved by the source device.

In certain embodiments, it may be desirable to preserve portions of the source device's layout to eliminate the need for translation or synthesis of the circuit design. This may be done in instances where the source device and the mask-programmable device share a virtually identical logic resource architecture. For example, in the case of converting a PLD, the LABs 12 used in the source PLD may be imported and placed as LABs 12 on the mask-programmable device without being further broken down into smaller elements (e.g., LEs 11) because although the LABs have different physical layouts, they have the same identical functionality. This allows the placement routine to assign portions of the source device's design on a LAB by LAB basis and thereby avoid further processing that would be necessary to implement the circuit design by placing fundamental logic blocks. It should be noted, however, that in many cases, LABs 12 end up in different locations on mask-programmed device 20 as compared to the source PLD because placement is done irrespective of location on the source device. It will be understood, however, that placement may be done at the LE level so long as the LE structure within the LABs is maintained but this will generally take longer and will require more involved testing procedures.

After the placement of logic resources of the present invention is complete, the resulting placement information is converted into a physical coordinate data file that represents the physical locations of the circuit blocks on base device 10 (step 245). This information is used to determine how to interconnect the logic resources placed at step 245 to form the required pre-existing circuit design. Such interconnections are provided in the appropriate mask metallization layers above base device 10 (e.g., see metallization layers 22 in FIG. 2). This may be thought of as the second step of physically programming device 10 (i.e., identifying the placement of the logic resources that are concurrently being configured at step 237 and need to be interconnected at step 255 to produce the desired logic design). The placement of all I/O cells 16 are typically fixed on the periphery of base device 10.

Next, at step 255, a routing routine generates a customized interconnection network used to interconnect the logic resources placed above. The routing routine uses connectivity information derived from netlist 240 and the physical coordinate information generated above to determine optimal ways for connecting the logic resources placed at step 245. This may be thought of as the third step of physically programming device 10 (i.e., connecting the logic resources placed above). Ultimately, the customized interconnect is implemented in the metallization layers above base device 10. The placement and routing steps described above may be performed in a manner similar to that used in known software for configuring PLDs.

One benefit associated with using a customized interconnect is that significantly less routing resources are used as compared to the source PLD because only the necessary interconnect is generated (i.e., none of the unused general purpose routing conductors on the source PLD are found in the customized interconnect). In addition, all of the programmable logic connectors used in the source PLD are removed, significantly decreasing the power consumption and size of mask-programmed device 20.

At this point, a software file representative of both the placement and interconnect of logic resources is complete. This representation may be used to check for physical design violations such as excessive fanout or antenna violations (step 260). For example, a test of this design representation may reveal that a node associated with a certain LE 11 has an excessive fanout which may cause a slow response time or increased power consumption. This problem may be corrected by the insertion of buffer circuitry into the burdened circuit path to increase signal strength. Such buffer circuitry may then be added to netlist 240 at step 260. Buffer circuitry may be created by programming some of the above-mentioned gate array sites 15, as described in the commonly assigned, co-pending U.S. patent application Ser. No. 10/113,324, filed Mar. 29, 2002, which is hereby incorporated by reference in its entirety.

After step 260 is complete, interconnect parasitic capacitance and resistance information may be generated on the resulting circuit layout (step 265). This information may be converted into a Standard Delay Format File (.sdf file) with a delay calculation tool to estimate propagation delays. Both minimum and maximum delays may be estimated to identify potential Setup time violations (signals that are too slow and therefore don't meet the user's specified timing requirements) and/or Hold time violations (signals that are too fast and may not be processed properly).

Next, at step 270, the timing of the emerging circuit design may be analyzed and corrected after steps 245–265 using the information generated at step 265. Timing violations may be identified by comparing the timing requirements provided by the user to those estimated at step 265. Setup time violations may be corrected in several ways. For example, additional buffers may be used as described above to speed up signals, or if necessary, placement can be re-optimized by returning to step 245. Hold time violations may be corrected by the insertion of delay elements. These delay and buffer elements may be created by programming the above-mentioned gate array sites 15.

If any new elements have been added to netlist 240 to correct timing or design violations, the appropriate corrections should be implemented in netlist 240 at step 275. Afterwards, placement step 245 and routing step 255 should be reiterated to reflect these changes to netlist 240, followed by another iteration of testing for timing violations through step 270. Typically, only one or more iterations are necessary after the initial place and route.

If no timing violations are observed at step 270, the integrity of netlist 240 may be verified through static functional verification techniques that involve confirming that two versions of a design are functionally identical when certain constraints are applied (step 280). For example, original netlist 240 should be logically equivalent to a netlist 240 modified to correct for timing and/or design rule violations. This technique does not rely on any user-supplied simulation vectors. If the two versions of netlist 240 are not found to be functionally identical, then appropriate corrections are implemented in netlist 240 at step 285 to ensure functional equivalence (e.g., by adding or removing certain circuits, etc.). Steps 245–270 are then reiterated until a satisfactory circuit design is produced.

At this point, the placement and routing of the circuit design is complete (step 290). At step 295, a software file representing the circuit design developed from steps 240–280 is combined with a physical configuration file produced at step 237, completing the circuit design that is to be implemented in the mask-programmed device 20. This combination includes combining the physical configuration file produced at step 237 that contains the interconnection information specifying the particular configuration of each of the logic resources placed at step 245 and routed at step 255. This produces, for example, the exact physical coordinates of all logic resources that need to be interconnected on base device 10 to produce a particular circuit design. It also includes the physical coordinates of all the interconnect paths that need to be generated in the mask layers to provide the necessary interconnection.

Before manufacturing the customized metal interconnect, however, the physical layout may be verified. This typically involves checking for design rule violations and also ensuring that the interconnect was physically implemented correctly (step 299). These processes are sometimes known as design rule checks (DRCs) and layout versus schematic verification (LVS). At this point, the metal interconnect is generated and coupled to base device 10 to produce mask-programmed device 20 (step 297). Following step 299, additional steps may be performed to ensure device 20 operates properly, including, for example using scan chain technology to observe certain nodes within device 20 (not shown).

It will be appreciated that the ability to create even smaller mask-programmed logic devices 20 from pre-existing logic designs provides circuit designers with a cost effective short cycle-time alternative to costly application-specific integrated circuit technologies (ASICs). Furthermore, the ability to produce mask-programmed devices as described above allows circuit designers to combine logic designs from smaller capacity PLDs, such as Altera's Flex® 400, 600, 800, 1000, 8K, 10K, and high capacity FPGAs, such as the APEX®, Cyclone®, and Stratix® families of products, or similar devices, and replace them with a single mask-programmed device 20 with no configuration-related logic circuitry, which saves die area and reduces overall power consumption more than was previously possible.

Figure 15:
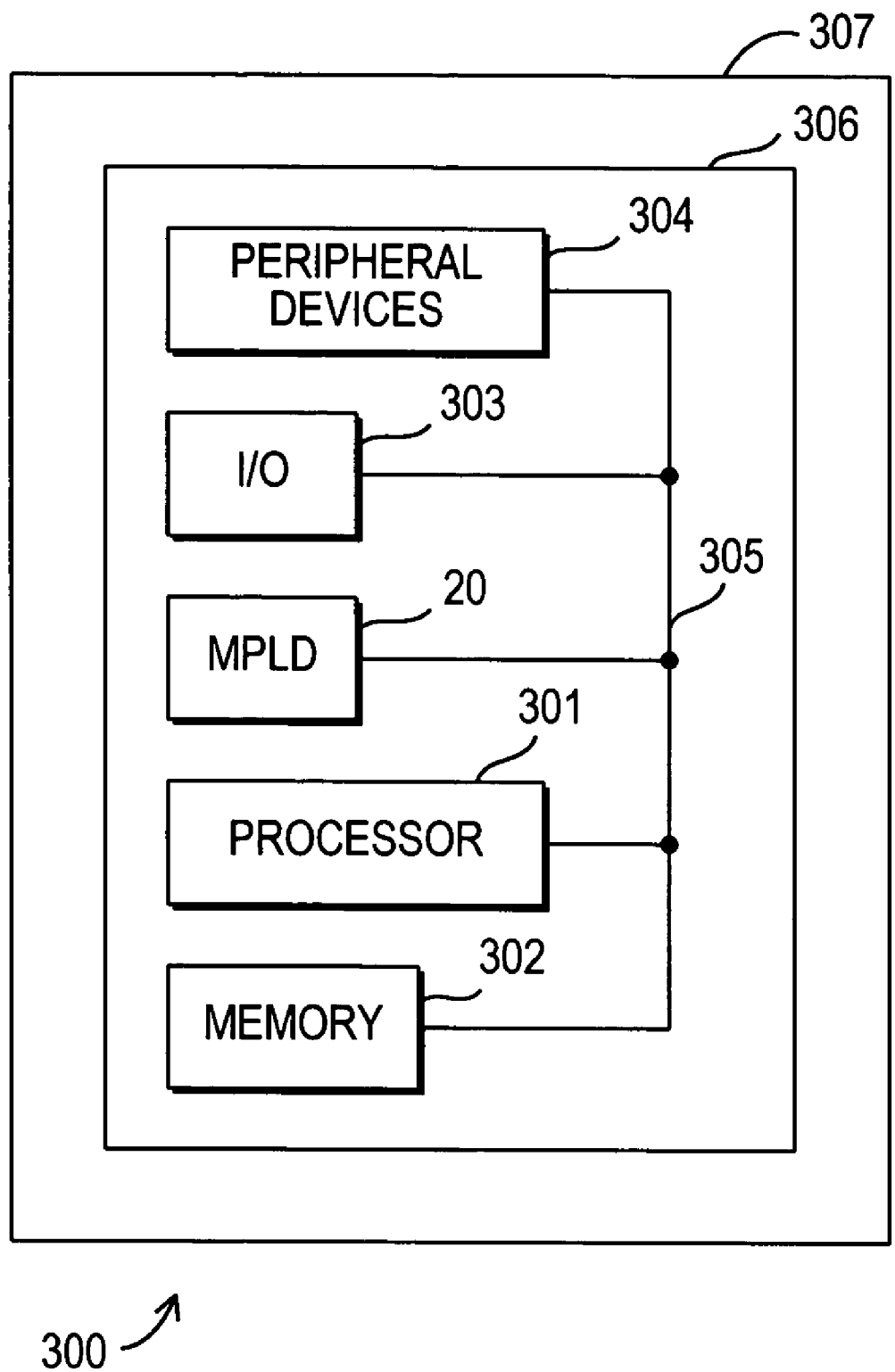
FIG. 15 is a simplified block diagram of an illustrative system employing a mask-programmed device in accordance with the present invention.

Mask-programmed logic device 20 constructed according to the method described above may be used as part of a data processing system 300 shown in FIG. 15. Data processing system 300 may include one or more of the following components: a processor 301; memory 302; I/O circuitry 303; and peripheral devices 304. These components are coupled together by a system bus 305 and are populated on a circuit board 306, which is contained in an end-user system 307.

System 300 can be used in a wide variety of applications, such as computer networking, data networking, instrumentation, video processing, digital signal processing, or any other application where the advantage of using mask-programmable logic is desirable. Mask-programmed logic device 20 can be configured to perform a variety of different logic functions. For example, mask-programmed logic device 20 can be configured as a processor or controller that works in cooperation with processor 301. Mask-programmed logic device 20 may also be used as an arbiter for arbitrating access to shared resources in system 300. In yet another example, mask-programmed logic device 20 can be configured as an interface between processor 301 and one of the other components in system 300. It should be noted that system 300 is only exemplary, and that the true scope and spirit of the invention should be indicated by the following claims.

Various integrated circuit process technologies can be used to implement mask-programmed logic devices 20 as described above according to this invention. In addition, other known programming techniques such as fuse-based programming could be substituted for the mask programming discussed in detail and still practice the principles of the invention.

It will be understood, therefore, that the foregoing is only illustrative of the principles of the invention, and that various modifications can be made by those skilled in the art without departing from the scope and spirit of the invention, and the present invention is limited only by the claims that follow.

What is claimed is:

1. A mask-programmable logic device disposed on an integrated circuit and configured to facilitate a conversion of a pre-existing design of a source programmable logic device into the mask-programmable logic device, comprising:
   a plurality of mask-programmable logic resources disposed on a substrate of the integrated circuit; and
   a plurality of interconnection conductors coupled to the plurality of mask-programmable logic resources and disposed above the substrate for interconnecting the plurality of mask-programmable logic resources, wherein at least one of the plurality of mask-programmable logic resources comprises:
   at least one smart switch disposed on the substrate, the smart switch being programmable to perform a function of a configuration-related logic circuit of the pre-existing design of the source programmable logic device.

2. The mask-programmable logic device of claim 1, wherein the function of the configuration-related logic circuit is dependant on at least one configurable value of the source programmable logic device.

3. The mask-programmable logic device of claim 1, wherein the smart switch does not include a transistor.

4. The mask-programmable logic device of claim 1, wherein the smart switch includes a fixed contact point that extends from the substrate to a first mask layer.

5. The mask-programmable logic device of claim 4, further comprising at least one interconnection segment coupled to the fixed contact point and located on a mask layer for programming the smart switch to implement the function.

6. The mask-programmable logic device of claim 1, wherein the smart switch includes a plurality of fixed input contact points and a fixed output contact point, wherein the input and output contact points extend from the substrate to a first mask layer.

7. The mask-programmable logic device of claim 6 further comprising at least one interconnection segment coupled to one of the input contact points and to the output contact point, wherein the at least one interconnection segment is located on a mask layer for programming the smart switch to implement the function.

8. The mask-programmable logic device of claim 6, wherein the smart switch includes a place holder expression for each of the input contact points, wherein each place holder expression is derived from the function of the configuration-related logic circuit and dependant on at least one configurable value of the source programmable logic device.

9. The mask-programmable logic device of claim 8 further comprising at least one interconnection segment located on a mask layer and coupled to the output contact pin and one of the input contact points selected by evaluating each of the place holder expressions with the at least one configurable value of the source programmable logic device.

10. A digital processing system comprising:
    processing circuitry;
    a memory coupled to the processing circuitry; and
    a mask-programmable logic device as defined in claim 1 coupled to the processing circuitry and the memory.

11. A printed circuit board on which is mounted a mask-programmable logic device as defined in claim 1.

12. The printed circuit board defined in claim 11 further comprising:
    a memory mounted on the printed circuit board and coupled to the mask-programmable logic device.

13. The printed circuit board defined in claim 12 further comprising:
    processing circuitry mounted on the printed circuit board and coupled to the mask-programmable logic device.

14. A method of creating a mask-programmable logic device from a pre-existing design of a source programmable logic device, comprising:
    receiving schematic information representing the pre-existing design of the source programmable logic device;
    removing configurable memory and routing resources from the received schematic information;
    replacing at least a first configuration-related logic resource of the received schematic information with at least a first smart switch that is mask-programmable to perform a function of the first configuration-related logic resource.

15. The method of claim 14, wherein the function of the first configuration-related logic resource is dependant on at least one configurable memory value of the source programmable logic device.

16. The method of claim 14, wherein the first smart switch is disposed on a substrate and includes a plurality of fixed input contact points and a fixed output contact point, and wherein each one of the fixed input contact points and the fixed output contact point extends from the substrate to a first mask layer.

17. The method of claim 16, wherein the replacing comprises deriving a place holder expression for each input contact pin that is derived from the function of the first configuration-related logic resource.

18. The method of claim 17 further comprising:
receiving configuration information including configurable memory values of the source programmable logic device.

19. The method of claim 18, wherein each place holder expression is a Boolean expression dependant on at least one of the configurable memory values.

20. The method of claim 19 further comprising:

programming the first smart switch by evaluating each of the place holder expressions with the configuration information and by coupling an appropriate one of the input contact pins to the output contact pin with an interconnection segment located on the first mask layer.

* * * * *